United States Patent
Shpunt et al.

(10) Patent No.: US 9,703,096 B2
(45) Date of Patent: Jul. 11, 2017

(54) ASYMMETRIC MEMS MIRROR ASSEMBLY

(71) Applicant: APPLE INC., Cupertino, CA (US)

(72) Inventors: Alexander Shpunt, Portola Valley, CA (US); Yuval Gerson, Cupertino, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 14/975,871

(22) Filed: Dec. 21, 2015

(65) Prior Publication Data

US 2017/0090184 A1 Mar. 30, 2017

Related U.S. Application Data

(60) Provisional application No. 62/234,686, filed on Sep. 30, 2015.

(51) Int. Cl.
| | |
|---|---|
| *G02B 26/08* | (2006.01) |
| *G02B 26/10* | (2006.01) |
| *B81B 3/00* | (2006.01) |
| *B81C 1/00* | (2006.01) |

(52) U.S. Cl.
CPC .......... *G02B 26/101* (2013.01); *B81B 3/0051* (2013.01); *B81C 1/00007* (2013.01); *G02B 26/0841* (2013.01); *B81B 2201/042* (2013.01); *B81B 2203/0136* (2013.01)

(58) Field of Classification Search
CPC .. G02B 26/10; G02B 26/101; G02B 26/0833; G02B 26/0858; G02B 7/182; G02B 26/08; G02B 26/0816; G02B 6/3512; G02B 26/0841

See application file for complete search history.

(56) References Cited

U.S. PATENT DOCUMENTS

| | | | |
|---|---|---|---|
| 3,918,068 | A | 11/1975 | Reinke et al. |
| 4,003,626 | A | 1/1977 | Reinke et al. |
| 5,629,790 | A | 5/1997 | Neukermans et al. |
| 5,742,419 | A | 4/1998 | Dickensheets et al. |
| 5,847,859 | A | 12/1998 | Murata |
| 5,938,989 | A | 8/1999 | Hambright |

(Continued)

FOREIGN PATENT DOCUMENTS

| | | |
|---|---|---|
| CN | 1621322 A | 6/2005 |
| CN | 101308343 A | 11/2008 |

(Continued)

OTHER PUBLICATIONS

Judy et al., "Magnetic Microactuation of Polysilicon Flexure Structures," Solid-State Sensor and Actuator Workshop, year 1994.

(Continued)

*Primary Examiner* — Euncha Cherry
(74) *Attorney, Agent, or Firm* — D. Kligler IP Services Ltd.

(57) ABSTRACT

A mirror assembly includes a frame having a central opening and a mirror plate, which is contained within the central opening of the frame and is shaped to define separate first and second mirrors connected by a bridge extending between the first and second mirrors. A pair of hinges are connected between the frame and the mirror plate at locations on the central axis on opposing sides of the frame so as to enable rotation of the mirror plate about the central axis relative to the frame.

18 Claims, 3 Drawing Sheets

(56) References Cited

U.S. PATENT DOCUMENTS

| | | | |
|---|---|---|---|
| 6,140,979 A | 10/2000 | Gerhard et al. | |
| 6,517,751 B1 | 2/2003 | Hambright | |
| 6,603,894 B1 | 8/2003 | Pu | |
| 6,753,638 B2 * | 6/2004 | Adams | H02N 1/008 310/309 |
| 6,825,967 B1 | 11/2004 | Chong et al. | |
| 6,882,770 B2 | 4/2005 | Neilson et al. | |
| 6,941,034 B2 | 9/2005 | Kuboi | |
| 7,609,875 B2 | 10/2009 | Liu et al. | |
| 7,952,781 B2 * | 5/2011 | Weiss | G02B 26/085 359/201.1 |
| 8,018,579 B1 | 9/2011 | Krah | |
| 8,437,063 B2 | 5/2013 | Weiss et al. | |
| 8,624,177 B2 | 1/2014 | Campion et al. | |
| 8,752,969 B1 | 6/2014 | Kane et al. | |
| 8,797,623 B2 | 8/2014 | Weiss et al. | |
| 2002/0070335 A1 | 6/2002 | Orcutt et al. | |
| 2002/0071169 A1 | 6/2002 | Bowers et al. | |
| 2002/0075786 A1 | 6/2002 | Ikegame et al. | |
| 2003/0137711 A1 | 7/2003 | Yagi et al. | |
| 2003/0162313 A1 | 8/2003 | Kim et al. | |
| 2004/0004775 A1 | 1/2004 | Turner | |
| 2004/0021852 A1 | 2/2004 | DeFlumere | |
| 2004/0040648 A1 | 3/2004 | Harden et al. | |
| 2004/0063235 A1 | 4/2004 | Chang | |
| 2004/0070816 A1 | 4/2004 | Kato et al. | |
| 2004/0081391 A1 | 4/2004 | Ko et al. | |
| 2004/0105139 A1 | 6/2004 | Hirose et al. | |
| 2004/0207744 A1 | 10/2004 | Bock | |
| 2004/0214350 A1 | 10/2004 | Pan et al. | |
| 2007/0064293 A1 | 3/2007 | Turner et al. | |
| 2008/0143196 A1 | 6/2008 | Sprague et al. | |
| 2008/0225368 A1 | 9/2008 | Ciabattoni et al. | |
| 2009/0002678 A1 | 1/2009 | Tanaka et al. | |
| 2009/0161177 A1 | 6/2009 | Nomura | |
| 2009/0284817 A1 | 11/2009 | Orcutt | |
| 2009/0294638 A1 | 12/2009 | Mohanty et al. | |
| 2010/0046054 A1 | 2/2010 | Jeong et al. | |
| 2010/0142020 A1 | 6/2010 | Kim | |
| 2010/0182667 A1 | 7/2010 | Ishida | |
| 2010/0253989 A1 | 10/2010 | Shimizu et al. | |
| 2010/0302617 A1 | 12/2010 | Zhou | |
| 2011/0188054 A1 | 8/2011 | Petronius et al. | |
| 2011/0205609 A1 | 8/2011 | Mizoguchi | |
| 2011/0228251 A1 | 9/2011 | Yee et al. | |
| 2011/0228367 A1 | 9/2011 | Lubianiker et al. | |
| 2011/0279648 A1 | 11/2011 | Lutian et al. | |
| 2011/0310125 A1 | 12/2011 | McEldowney et al. | |
| 2012/0236379 A1 | 9/2012 | DaSilva et al. | |
| 2012/0250124 A1 | 10/2012 | Choi et al. | |
| 2012/0307211 A1 | 12/2012 | Hofmann et al. | |
| 2013/0206967 A1 | 8/2013 | Shpunt et al. | |
| 2013/0207970 A1 | 8/2013 | Shpunt et al. | |
| 2013/0301101 A1 | 11/2013 | Conrad et al. | |
| 2014/0153001 A1 | 6/2014 | Chayat et al. | |
| 2014/0226145 A1 | 8/2014 | Steffey et al. | |
| 2014/0291491 A1 | 10/2014 | Shpunt et al. | |
| 2014/0291496 A1 | 10/2014 | Shpunt et al. | |
| 2014/0310914 A1 | 10/2014 | Erlich et al. | |
| 2014/0313519 A1 | 10/2014 | Shpunt et al. | |
| 2015/0234179 A1 | 8/2015 | Shpunt | |
| 2016/0178895 A1 | 6/2016 | Gerson et al. | |

FOREIGN PATENT DOCUMENTS

| | | |
|---|---|---|
| DE | 102011113147 B3 | 1/2013 |
| EP | 1548487 A1 | 6/2005 |
| EP | 2333603 A1 | 6/2011 |
| EP | 2363686 A1 | 9/2011 |
| GB | 2271436 A | 4/1994 |
| JP | 2004191918 A | 7/2004 |
| KR | 100867147 B1 | 11/2008 |
| WO | 0247241 A1 | 6/2002 |
| WO | 03/049156 A2 | 6/2003 |
| WO | 2005078509 A2 | 8/2005 |
| WO | 2012/020380 A1 | 2/2012 |
| WO | 2012013536 A1 | 2/2012 |
| WO | 2014016794 A1 | 1/2014 |
| WO | 2014064606 A1 | 5/2014 |

OTHER PUBLICATIONS

Judy et al., "Magnetically Actuated, Addressable Microstructures," Journal of Microelectromechanical Systems, vol. 6, No. 3, pp. 249-256, Sep. 1997.

Cho et al., "A Scanning Micromirror Using a Bi-Directionally Movable Magnetic Microactuator," Proceedings of SPIE, MOEMS and Miniaturized Systems, vol. 4178, pp. 106-115, USA 2000.

Hamamatsu Photonics K.K., "Position sensitive detectors", Japan, Feb. 2010.

Gale, M.T., "Replication Technology for Diffractive Optical Elements", Proceedings of SPIE, vol. 3010, pp. 111-123, May 15, 1997.

Kolste et al., "Injection Molding for Diffractive Optics", Proceedings of SPIE, vol. 2404, pp. 129-131, Feb. 9, 1995.

Gale et al., "Replicated Microstructures for Integrated Topics", Proceedings of SPIE, vol. 2513, pp. 2-10, Aug. 29, 1994.

Jahns et al., "Diffractive Optics and Micro-Optics: Introduction to the Feature Issue", Applied Optics Journal, vol. 36, No. 20, pp. 4633-4634, Jul. 10, 1997.

Nikolejeff et al., "Replication of Continuous Relief Diffractive Optical Elements by Conventional Compact Disc Injection-Molding Techniques", Applied Optics Journal, vol. 36, No. 20, pp. 4655-4659, Jul. 10, 1997.

Neyer et al., "New Fabrication Technology for Polymer Optical Waveguides", Integrated Photonics Research, pp. 248-249, year 1992.

Neyer et al., "Fabrication of Low Loss Polymer Waveguides Using Injection Moulding Technology", Electronics Letters, vol. 29, No. 4, pp. 399-401, Feb. 18, 1993.

Optical Society of America, "Diffractive Optics and Micro-Optics", 1996 Technical Digest Series, vol. 5, Boston, USA, Apr. 29-May 2, 1996.

Lintec Corporation, "Adwill D-510T Tape", Japan, Apr. 4, 2006.

Stark, B., "MEMS Reliability Assurance Guidelines for Space Applications", Jet Propulsion Laboratory, California Institute of Technology, Pasadena, USA, Jan. 1999.

Fraunhofer Institute for Photonic Microsystems, "Lamda—Large Aperture MEMS Scanner Module for 3D Distance Measurement"—Data sheet, Dresden, Germany, 2 pages, May 9, 2012.

International Application # PCT/IB2013/056101 Search Report Dated Dec. 17, 2013.

Fujita et al., "Dual-Axis MEMS Mirror for Large Deflection-Angle Using SU-8 Soft Torsion Beam," Sensors and Actuators A: Physical, vol. 121, issue 1, pp. 16-21, May 2005.

Stone et al., "Performance Analysis of Next-Generation LADAR for Manufacturing, Construction, and Mobility", National Institute of Standards and Technology, document # NISTIR 7117, Gaithersburg, USA, May 2004.

U.S. Appl. No. 13/798,251 Office Action dated Nov. 20, 2014.

International Application PCT/IB2013/051985 Search Report dated Jul. 22, 2013.

International Application PCT/IB2013/051189 Search Report Dated Jun. 18, 2013.

Minifaros, "D1.1-ProjectPresentation", V3.0, 36 pages, Dec. 22, 2010.

Sandenr et al., "Large Aperture MEMS Segmented Scanner Module for LIDAR Systems", SPAR Conference—Europe, Amsterdam, 48 pages, Dec. 8, 2010.

Gerson et al., U.S. Appl. No. 14/599,507, filed Nov. 18, 2014.

Shpunt et al., U.S. Appl. No. 14/554,086, filed Nov. 26, 2014.

Shpunt et al., U.S. Appl. No. 14/554,078, filed Nov. 26, 2014.

Niclass et al., "Design and characterization of a 256×64-pixel single-photon imager in CMOS for a MEMS based laser scanning time-of-flight sensor", Optics Express, vol. 20, No. 11, pp. 11863-11881, May 21, 2012.

(56) References Cited

OTHER PUBLICATIONS

Hah et al., "Theory and Experiments of Angular Vertical Comb-Drive Actuators for Scanning Micromirrors", IEEE Journal of Selected Topics in Quantum Electronics, vol. 10, No. 3, pp. 505-513, May/Jun. 2004.
International Application # PCT/US15/56297 Search Report dated Jan. 19, 2016.
Sandner et al., "3D imaging using resonant large-aperture MEMS mirror arrays and laser distance measurement", Optical MEMs and Nanophotonics, IEEE/LEOS International Conference, pp. 78-79, Aug. 11, 2008.
CN Application # 201380015506.3 Office Action dated Mar. 31, 2016.
Gerson et al., U.S. Appl. No. 14/941,599, filed Nov. 15, 2015.
Shpunt et al., U.S. Appl. No. 14/551,104, filed Nov. 24, 2014.
Erlich et al., U.S. Appl. No. 14/622,942, filed Feb. 16, 2015.
Yang et al., "Phase synchronization of micro-mirror arrays using elastic linkages", Sensors and Actuators A, Elsevier Sequoia, vol. 95, No. 1, pp. 55-60, Dec. 15, 2001.
Gruger et al., "New approach for MEMS scanning mirror for laser projection systems", SPIE Proceedings, vol. 6887, MOEMS and Miniaturized Systems VII, pp. 68870L-68870L, Feb. 8, 2008.
International Application # PCT/US2015/67974 Search Report dated May 3, 2016.
CN Application # 201380015506.3 Office Action dated Aug. 16, 2016.
U.S. Appl. No. 14/599,507 Office Action dated Oct. 20, 2016.
U.S. Appl. No. 14/551,104 Office Action dated Nov. 1, 2016.
International Application # PCT/US2016/45452 Search Report dated Oct. 28, 2016.
Sandner et al., "Synchronized microscanner array for large aperture receiver optics of LIDAR systems", Proceedings of SPIE—The International Society for Optical Engineering, vol. 7594, 12 pages, Feb. 17, 2010.
U.S. Appl. No. 14/554,086 Office Action dated Mar. 10, 2017.
U.S. Appl. No. 14/599,507 Office Action dated Mar. 8, 2017.
U.S. Appl. No. 14/554,078 Office Action dated May 31, 2017.

* cited by examiner

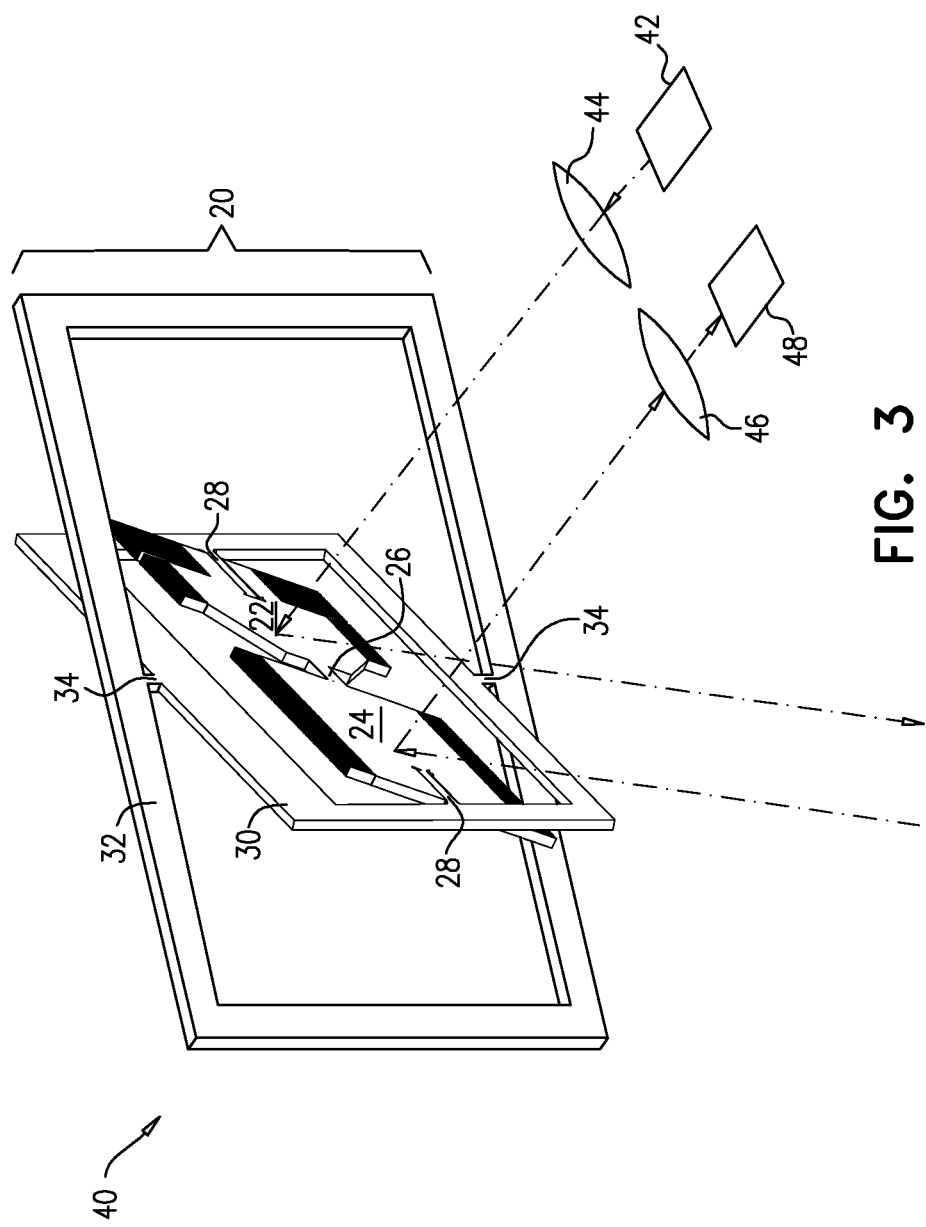

ASYMMETRIC MEMS MIRROR ASSEMBLY

CROSS-REFERENCE TO RELATED APPLICATION

This application claims the benefit of U.S. Provisional Patent Application 62/234,686, filed Sep. 30, 2015, which is incorporated herein by reference.

FIELD OF THE INVENTION

The present invention relates generally to micro-mechanical systems (MEMS), and particularly to optical scanning using such systems.

BACKGROUND

MEMS-based optical scanners are used in a variety of applications. For example, U.S. Pat. No. 7,952,781, whose disclosure is incorporated herein by reference, describes a method of scanning a light beam and a method of manufacturing a microelectromechanical system (MEMS), which can be incorporated in a scanning device.

U.S. Patent Application Publication 2013/0207970, whose disclosure is incorporated herein by reference, describes a scanning depth engine, which includes a transmitter, which emits a beam comprising pulses of light, and a scanner, which is configured to scan the beam, within a predefined scan range, over a scene. The scanner may comprise a micromirror produced using MEMS technology. A receiver receives the light reflected from the scene and generates an output indicative of the time of flight of the pulses to and from points in the scene. A processor is coupled to control the scanner and to process the output of the receiver so as to generate a 3D map of the scene.

PCT International Publication WO 2015/109273, whose disclosure is incorporated herein by reference, describes a scanning device, which includes a substrate, which is etched to define an array of two or more parallel rotating members, such as scanning mirrors, and a gimbal surrounding the rotating members. First hinges connect the gimbal to the substrate and defining a first axis of rotation, about which the gimbal rotates relative to the substrate. Second hinges connect the rotating members to the support and defining respective second, mutually-parallel axes of rotation of the rotating members relative to the support, which are not parallel to the first axis. In some embodiments, coupling means between the mirrors in the array couple the oscillations of the mirrors and thus maintain the synchronization between them.

SUMMARY

Embodiments of the present invention that are described hereinbelow provide improved scanning devices and methods.

There is therefore provided, in accordance with an embodiment of the invention, a mirror assembly, including a frame having a central opening and a mirror plate, which is contained within the central opening of the frame and is shaped to define separate first and second mirrors connected by a bridge extending between the first and second mirrors. A pair of hinges are connected between the frame and the mirror plate at locations on the central axis on opposing sides of the frame so as to enable rotation of the mirror plate about the central axis relative to the frame.

In some embodiments, the first and second mirrors have respective first and second widths, and the bridge has a bridge width, all measured in a dimension perpendicular to the central axis, such that the bridge width is less than one-fourth the first and second widths. In a disclosed embodiment, the bridge includes a neck, which extends along a central axis of the mirror plate, and the first mirror has a shape that tapers from a first width to a narrower width in proximity to the neck.

In some embodiments, the first and second mirrors have different, respective shapes and sizes. In one embodiment, the second mirror is larger than the first mirror, and the hinges include first and second hinges, which are respectively connected between the first and second mirrors and the frame, wherein the second hinge is stiffer than the first hinge.

In a disclosed embodiment, the frame, the mirror plate and the hinges include an epitaxial semiconductor material, which is etched to define and separate the mirror plate and the hinges from the frame. Typically, a reflective coating is deposited over the semiconductor mirror in an area of the first and second mirrors but is not deposited on the bridge. Additionally or alternatively, the hinges include torsion hinges.

In some embodiments, the assembly includes a first comb extending outward from the mirror plate, and a second comb extending inward from the frame so as to interleave with the first comb, wherein the first and second combs include a conductive material. Additionally or alternatively, the assembly includes a base surrounding the frame and rotationally connected to the frame so that the frame rotates, relative to the base, about a frame axis that is perpendicular to the central axis of the mirror plate.

There is also provided, in accordance with an embodiment of the invention, a scanning device, including scanner, which includes a frame having a central opening and a mirror plate, which is contained within the central opening of the frame and is shaped to define separate first and second mirrors connected by a bridge extending between the first and second mirrors. A pair of hinges are connected between the frame and the mirror plate at locations on the central axis on opposing sides of the frame so as to enable rotation of the mirror plate about the central axis relative to the frame. A transmitter is configured to emit a beam of light toward the first mirror, which reflects the beam so that the scanner scans the beam over a scene. A receiver is configured to receive, by reflection from the second mirror, the light reflected from the scene and to generate an output indicative of the light received from points in the scene.

In a disclosed embodiment, the scanner includes a base surrounding the frame and rotationally connected to the frame so that the frame rotates, relative to the base, about a frame axis that is perpendicular to the central axis of the mirror plate while the mirror plate rotates relative to the frame.

Typically, the mirror plate is configured to rotate about the hinges at a resonant frequency of the scanner, while the bridge is sufficiently stiff to synchronize the rotation of the first and second mirrors in amplitude and phase at the resonant frequency.

In some embodiments, the scanner includes a first comb extending outward from the mirror plate, and a second comb extending inward from the frame so as to interleave with the first comb, wherein the first and second combs include a conductive material and are configured to drive the rotation of the mirror plate by electrostatic force due to a voltage applied between the first and second combs.

There is additionally provided, in accordance with an embodiment of the invention, a method for producing a mirror assembly. The method includes etching a semiconductor wafer to define a frame having a central opening and a mirror plate, which is contained within the central opening of the frame and is shaped to define separate first and second mirrors connected by a bridge extending between the first and second mirrors. The wafer is also etched to define a pair of hinges, which are connected between the frame and the mirror plate at locations on the central axis on opposing sides of the frame so as to enable rotation of the mirror plate about the central axis relative to the frame.

The present invention will be more fully understood from the following detailed description of the embodiments thereof, taken together with the drawings in which:

BRIEF DESCRIPTION OF THE DRAWINGS

FIGS. 2 and 3 are schematic, pictorial illustrations of a scanning device based on the array of FIG. 1, shown at two different scan angles, in accordance with an embodiment of the invention.

DETAILED DESCRIPTION OF EMBODIMENTS

Figure 1:
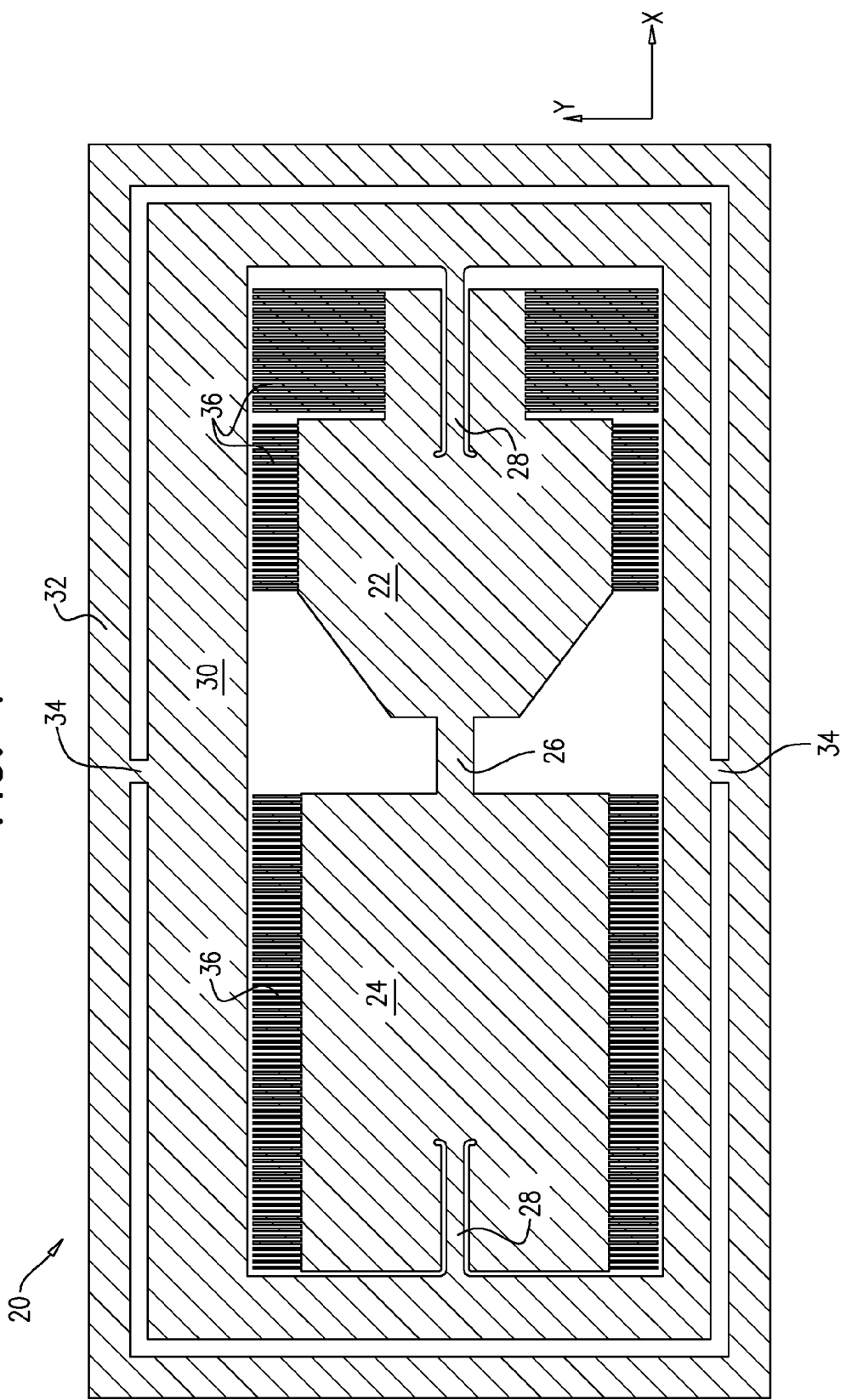
FIG. 1 is a schematic frontal view of a gimbaled micromirror array, in accordance with an embodiment of the invention.

The above-mentioned PCT International Publication WO 2015/109273 describes arrays of multiple scanning mirrors that are weakly coupled together in order to synchronize the oscillations of the mirrors in the array. U.S. patent application Ser. No. 14/551,104, filed Nov. 24, 2014, whose disclosure is incorporated herein by reference, describes an application of this technique in synchronizing separate transmit (Tx) and receive (Rx) mirrors. An advantage of this approach is that the individual mirrors in the array have low inertia and can be thus be driven with minimal power input at oscillation frequencies near the system resonant frequency. In practice, however, even small manufacturing deviations in the dimensions of the mirrors and the hinges on which they are mounted can lead to loss of precise amplitude and/or phase synchronization between the mirrors in the array.

Embodiments of the present invention that are described herein address this problem by coupling the transmit and receive mirrors strongly together, while using an asymmetric design to reduce inertia and reduce undesired scattering of the transmitted beam. Specifically, in the disclosed embodiment, the transmit and receive mirrors are coupled together by a narrow mechanical bridge, which ensures that the two mirrors will rotate at the same system frequency. Precise synchronization, in both phase and amplitude, between the two mirrors is achieved by matching the hinge stiffness and the inertia of the transmit and receive mirrors.

In the embodiments shown and described hereinbelow, the bridge has the form of a neck, running along the central axis of the mirror plate, which is also the axis of rotation. Alternatively, however, the bridge may have a different form, such as two or more parallel struts between the two mirrors. Typically, the width of the bridge, i.e., the aggregate dimension of the bridge or the multiple parts of the bridge measured perpendicular to the direction of rotation, is less than half the width of the mirrors and can advantageously be less than one-fourth the width of the mirrors.

In the disclosed embodiment, the size of the transmit mirror is reduced to approximately the minimum dimensions required to cover the entire area of the transmitted beam—which is typically considerably smaller than the collection area required to receive the reflected beam efficiently. The design takes into account the changing location and angle of incidence of the transmitted beam on the mirror as the mirror assembly rotates. Reduction of the transmit mirror size in this manner reduces inertia, as well as air drag, and thus reduces the power required to drive the mirror assembly. The shape and size of the transmit mirror are chosen so as to inhibit specular reflection of the beam emitted from the transmitter into the field of view of the receiver. The narrow bridge intervening between the transmit and receive mirrors is also useful in this regard, and in some embodiments may be made non-reflective for this purpose.

FIG. 1 is a schematic frontal view of a gimbaled micromirror array 20, in accordance with an embodiment of the invention. Array 20 is typically produced by etching a semiconductor wafer, such as an epitaxial silicon wafer, to define a frame 30 having a central opening which contains a mirror plate comprising a transmit mirror 22 and a receive mirror 24. Mirrors 22 and 24 are separated by a rigid neck (which is also a part of the mirror plate), extending along the central axis of the mirror plate between the two mirrors. A pair of hinges 28, such as etched torsion hinges, are connected between frame 30 and the mirror plate at locations on the central axis on opposing sides of the frame, so as to enable rotation of the mirror plate about the central axis relative to the frame. Typically, a reflective coating is deposited on the wafer surface in the areas of mirrors 22 and 24. The reflective coating is typically omitted from neck 26, and the neck may even be coated with a light-absorbing layer, in order to reduce undesired specular reflections from the neck.

In the pictured embodiment, the wafer is also etched to define a base 32 surrounding frame 30 and rotationally connected to the frame by hinges 34. Thus, frame 30 serves as a gimbal and rotates, relative to base 32, about a frame axis that is perpendicular to the central axis of the mirror plate while the mirror plate rotates relative to the frame. Alternatively, for gimbaled operation, frame 30 may be mounted to rotate on bearings, as described, for example, in U.S. patent application Ser. No. 14/622,942, filed Feb. 16, 2015, whose disclosure is incorporated herein by reference. Further alternatively, frame 30 may be mounted statically, without gimbaling of the frame.

Typically, the mirror plate is configured to rotate about hinges 28 at a resonant frequency of array 20, while neck 26 is sufficiently stiff to synchronize the rotation of mirrors 22 and 24 in amplitude and phase at the resonant frequency. To reduce inertia and avoid stray specular reflections of the transmitted beam, however, the width of neck 26, measured in the direction perpendicular to the central axis of the mirror plate, is typically less than one-fourth the width of mirrors 22 and 24. In a typical application, the area of each of mirrors 22 and 24 is in the range of 2.5 to 50 mm$^2$, and the overall area of array 20 is on the order of 1 cm$^2$. Alternatively, larger or even smaller scanners of this sort may be produced, depending on application requirements.

Figure 2:
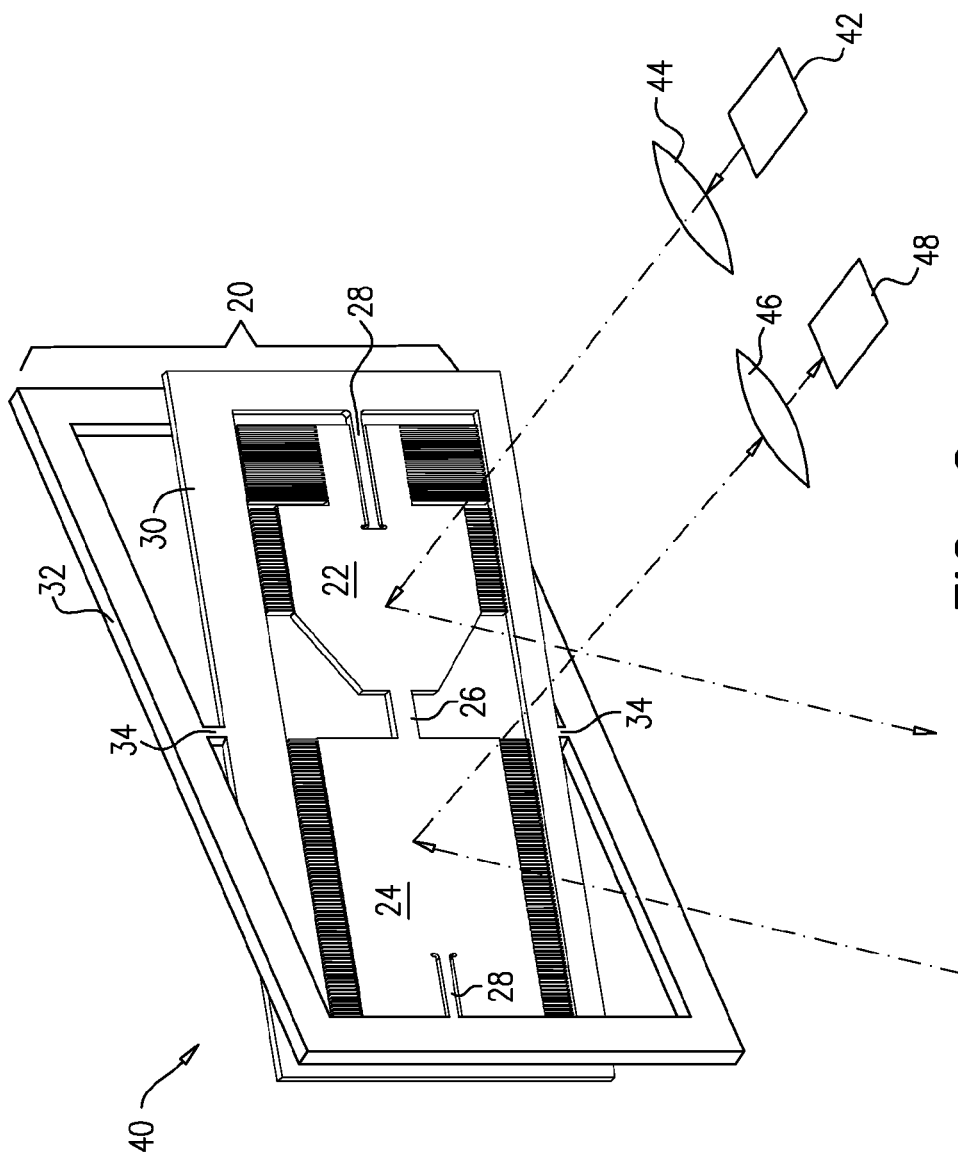

To further reduce inertia and undesired reflections, the shape of mirror 22 tapers from its full width near hinge 28 to a narrower width in proximity to neck 26. Mirrors 22 and 24 have different, respective shapes and sizes, which are matched to the optical requirements of the scanning device in which array 20 is used, as illustrated in FIGS. 2 and 3. The inventors have found the shape of mirror 22 that is shown in the figure, with diagonally-tapering edges, to be useful in achieving the desired optical performance and low inertia;

but other shapes of mirrors 22 and 24 may alternatively be used in accordance with system requirements.

To drive the rotation of the mirror plate, the semiconductor wafer is etched to define interleaved combs 36, including one set of combs extending outward from mirrors 22 and 24 and a second, interleaved set extending inward from frame 30. Combs 36 comprise a conductive material (typically deposited on the semiconductor surface), which is coupled by drive traces to an electrical drive circuit (not shown). Rotation of mirrors 22 and 24 is thus driven by electrostatic forces between combs 36, as is known in the art. Alternatively, any other suitable sort of drive, such as electromagnetic or piezoelectric drives, may be used to drive the rotation of the mirrors.

FIGS. 2 and 3 are schematic, pictorial illustrations of a scanning device 40 with a scanning mirror assembly based on array 20, shown at two different scan angles, in accordance with an embodiment of the invention. As noted earlier, the dimensions and masses of transmit and receive mirrors 22 and 24, neck 26, and hinges 28 are typically chosen so that the mirror plate rotates about hinges 28 by oscillation at a desired system resonant frequency. For more stable oscillation, hinges 28 may have different degrees of stiffness, with the hinge that is attached to the more massive receive mirror 24 being stiffer than the one attached to transmit mirror 22. On the other hand, frame 30 may be driven to rotate relative to base 32 in a non-resonant mode, typically at a frequency substantially lower than the resonant frequency of the mirror plate. The fast rotation of mirrors 22 and 24 about the X-axis and the slower rotation of frame 30 about the Y-axis may be coordinated so as to define a raster scan of the transmitted and received beams over an area of interest. Alternatively, the rotations of the mirror plate and frame may be controlled to generate scan patterns of other sorts.

A transmitter 42 emits pulses of light, which are collimated by a collimating lens 44 and directed toward transmit mirror 22, which reflects the beam so that the rotation of the mirror scans the beam over a scene. (The term "light," in the context of the present description and in the claims, refers to optical radiation of any wavelength, including visible, infrared, and ultraviolet radiation.) Light reflected back from the scene is directed by receive mirror 24 toward a collection lens 46, which focuses the reflected light onto a receiver 48. In alternative optical layouts (not shown in the figures), device 40 may comprise ancillary optical elements, such as reflectors and filters, in accordance with system requirements. In any case, device 40 is designed so that array 20 scans the transmitted and received beams of light together over a predefined angular range, so that at each point in the scan, receiver 48 receives light from the same area of the scene that is illuminated at that point by transmitter 42.

In one embodiment, scanning device 40 is used for depth sensing based on time of flight of the light pulses emitted by transmitter 42. In this sort of embodiment, transmitter 42 typically comprises a pulsed laser diode, while receiver 48 comprises a high-speed optoelectronic detector, such as an avalanche photodiode. Alternatively, any other suitable sorts of emitting and sensing components may be used in device 40.

The distance between mirrors 22 and 24 is chosen so as to enable placement of the transmit and receive optics (such as lenses 44 and 46) in the respective beam paths, and to eliminate specular reflections of the transmitted beam within device 40. In particular mirrors 22 and 24 are spaced sufficiently far apart so that specular reflections of the beam emitted by transmitter 42 do not fall within a field of view of receiver 48, and mirror 22 is shaped and sized in support of this objective. As can be seen in FIGS. 2 and 3, the beam emitted by transmitter 42 will strike different locations on mirror 22 depending on the scan angle. The tapered shape of mirror 22 is designed to contain the transmitted beam area over the entire scan range, while eliminating peripheral areas of the mirror that are not required for this purpose.

Although the figures described above show a particular optical design and layout of the components of scanning device 40, the principles of the present invention may be applied in scanning devices of other designs. For example, the scanning mirror assembly in device 40 may comprise mirrors and gimbals of different shapes, sizes, orientations and spacing from those shown in the figures. Alternative designs based on the principles set forth above will be apparent to those skilled in the art and are also considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A mirror assembly, comprising:
    a frame having a central opening;
    a mirror plate, which is contained within the central opening of the frame and is shaped to define separate first and second mirrors connected by a neck extending along a central axis of the mirror plate between the first and second mirrors,
    wherein the first mirror has a shape that tapers from a first width to a narrower width in proximity to the neck; and
    a pair of hinges, which are connected between the frame and the mirror plate at locations on the central axis on opposing sides of the frame so as to enable rotation of the mirror plate about the central axis relative to the frame.

2. The assembly according to claim 1, wherein the first and second mirrors have respective first and second widths, and the bridge has a bridge width, all measured in a dimension perpendicular to the central axis, such that the bridge width is less than one-fourth the first and second widths.

3. The assembly according to claim 1, wherein the first and second mirrors have different, respective shapes and sizes.

4. The assembly according to claim 3, wherein the second mirror is larger than the first mirror, and wherein the hinges comprise first and second hinges, which are respectively connected between the first and second mirrors and the frame, wherein the second hinge is stiffer than the first hinge.

5. The assembly according to claim 1, wherein the frame, the mirror plate and the hinges comprise an epitaxial semiconductor material, which is etched to define and separate the mirror plate and the hinges from the frame.

6. The assembly according to claim 5, wherein a reflective coating is deposited over the semiconductor mirror in an area of the first and second mirrors but is not deposited on the bridge.

7. The assembly according to claim 1, wherein the hinges comprise torsion hinges.

8. The assembly according to claim 1, and comprising a first comb extending outward from the mirror plate, and a second comb extending inward from the frame so as to interleave with the first comb, wherein the first and second combs comprise a conductive material.

9. The assembly according to claim 1, and comprising a base surrounding the frame and rotationally connected to the frame so that the frame rotates, relative to the base, about a frame axis that is perpendicular to the central axis of the mirror plate.

10. A scanning device, comprising:
a scanner, which comprises:
   a frame having a central opening;
   a mirror plate, which is contained within the central opening of the frame and is shaped to define separate first and second mirrors connected by a neck extending along a central axis of the mirror plate between the first and second mirrors,
   wherein the first mirror has a shape that tapers from a first width to a narrower width in proximity to the neck; and
   a pair of hinges, which are connected between the frame and the mirror plate at locations on the central axis on opposing sides of the frame so as to enable rotation of the mirror plate about the central axis relative to the frame;
a transmitter, which is configured to emit a beam of light toward the first mirror, which reflects the beam so that the scanner scans the beam over a scene; and
a receiver, which is configured to receive, by reflection from the second mirror, the light reflected from the scene and to generate an output indicative of the light received from points in the scene.

11. The device according to claim 10, wherein the scanner comprises a base surrounding the frame and rotationally connected to the frame so that the frame rotates, relative to the base, about a frame axis that is perpendicular to the central axis of the mirror plate while the mirror plate rotates relative to the frame.

12. The device according to claim 10, wherein the mirror plate is configured to rotate about the hinges at a resonant frequency of the scanner, while the bridge is sufficiently stiff to synchronize the rotation of the first and second mirrors in amplitude and phase at the resonant frequency.

13. The device according to claim 10, wherein the first and second mirrors have respective first and second widths, and the neck has a bridge width, all measured in a dimension perpendicular to the central axis, such that the bridge width is less than one-fourth the first and second widths.

14. The device according to claim 10, wherein the bridge comprises a neck, which extends along a central axis of the mirror plate, and wherein the first mirror has a shape that tapers from the first width to a narrower width in proximity to the neck so as to inhibit specular reflection of the emitted beam into a field of view of the receiver.

15. The device according to claim 10, wherein the first and second mirrors have different, respective shapes and sizes.

16. The device according to claim 10, wherein the scanner comprises a first comb extending outward from the mirror plate, and a second comb extending inward from the frame so as to interleave with the first comb, wherein the first and second combs comprise a conductive material and are configured to drive the rotation of the mirror plate by electrostatic force due to a voltage applied between the first and second combs.

17. A method for producing a mirror assembly, the method comprising etching a semiconductor wafer to define:
a frame having a central opening;
a mirror plate, which is contained within the central opening of the frame and is shaped to define separate first and second mirrors connected by a neck extending along a central axis of the mirror plate between the first and second mirrors,
   wherein the first mirror has a shape that tapers from a first width to a narrower width in proximity to the neck; and
a pair of hinges, which are connected between the frame and the mirror plate at locations on the central axis on opposing sides of the frame so as to enable rotation of the mirror plate about the central axis relative to the frame.

18. The method according to claim 17, wherein the hinges comprise torsion hinges.

* * * * *